United States Patent
Kadota

(10) Patent No.: US 7,523,283 B2
(45) Date of Patent: Apr. 21, 2009

(54) MEMORY CONTROL CIRCUIT IN A MEMORY CHIP

(75) Inventor: Daisuke Kadota, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 344 days.

(21) Appl. No.: 11/592,152

(22) Filed: Nov. 3, 2006

(65) Prior Publication Data
US 2007/0143556 A1  Jun. 21, 2007

(30) Foreign Application Priority Data
Dec. 21, 2005  (JP)  ............................. 2005-368386

(51) Int. Cl.
*G06F 12/00*  (2006.01)

(52) U.S. Cl. ...................................................... 711/167

(58) Field of Classification Search ........................ None
See application file for complete search history.

(56) References Cited

U.S. PATENT DOCUMENTS

| 5,973,951 | A | * | 10/1999 | Bechtolsheim et al. | ......... 365/52 |
| 6,301,636 | B1 | * | 10/2001 | Schultz et al. | .............. 711/108 |
| 2005/0041478 | A1 | * | 2/2005 | Matsushita et al. | ..... 365/185.29 |

* cited by examiner

*Primary Examiner*—Hiep T Nguyen
(74) *Attorney, Agent, or Firm*—Volentine & Whitt, P.L.L.C.

(57) ABSTRACT

A memory control circuit in a memory chip includes a selection controller that can switch the memory chip between selected and deselected states. The selection controller sends and receives access wait signals to and from at least one other memory chip. One access wait signal indicates that the selection controller has placed the memory chip in the deselected state. Another access wait signal, when received, causes the selection controller to place the memory chip in the selected state. A set of memory chips including this memory control circuit can shift access among themselves without receiving control signals from an external device. The external device can accordingly access the memory chips with minimal delays and minimal overhead.

19 Claims, 5 Drawing Sheets

MEMORY CONTROL CIRCUIT IN A MEMORY CHIP

BACKGROUND OF THE INVENTION

1. Field of the Invention

The present invention relates to a memory control circuit in a memory chip, more particularly to a memory control circuit that exchanges control signals with memory control circuits in other memory chips.

2. Description of the Related Art

In systems that access a plurality of memory chips, the memory chips are connected to a shared bus and are individually selected by chip select signals. In conventional systems, a processor or memory controller must generate a separate chip select signal for each memory chip, or a multi-bit chip select signal that can be decoded to select the memory chips individually. Each time memory access shifts from one chip to another, a new chip select signal and, for certain types of memory, other overhead signals must be generated. This overhead takes up time and imposes a processing load on the processor or memory controller. In read access, there is also a delay while the new memory chip senses and amplifies the data to be read. All of these factors slow down access operations, as will be shown in the detailed description of the invention.

It would be desirable for access to proceed continuously from one memory chip to another without delay, and without overhead.

SUMMARY OF THE INVENTION

An object of the present invention is to enable access to shift continuously among a plurality of memory chips.

Another object of the invention is to enable the memory chips to shift access among themselves autonomously.

The invention provides a memory control circuit disposed in a memory chip. The memory chip also has a memory array storing data for access by an external device. The memory chip operates in a selected state in which access is enabled and a deselected state in which access is disabled. The memory control circuit includes a selection controller that can switch the memory chip between the selected and deselected states.

The selection controller sends and receives access wait signals to and from at least one other memory chip. The access wait signals indicate transitions between the selected and deselected states. One access wait signal is preferably sent to indicate that the selection controller has placed the memory chip in the deselected state. Another access wait signal is preferably received to make the selection controller place the memory chip in the selected state.

The invention also provides a memory chip including the invented memory control circuit, and a system comprising a processor connected to a plurality of such memory chips. The memory chips can uses the access wait signals to select and deselect each other in a cyclic sequence, permitting access to shift from one memory chip to another without delay and without imposing an overhead load on the processor.

DETAILED DESCRIPTION OF THE INVENTION

Figure 1:
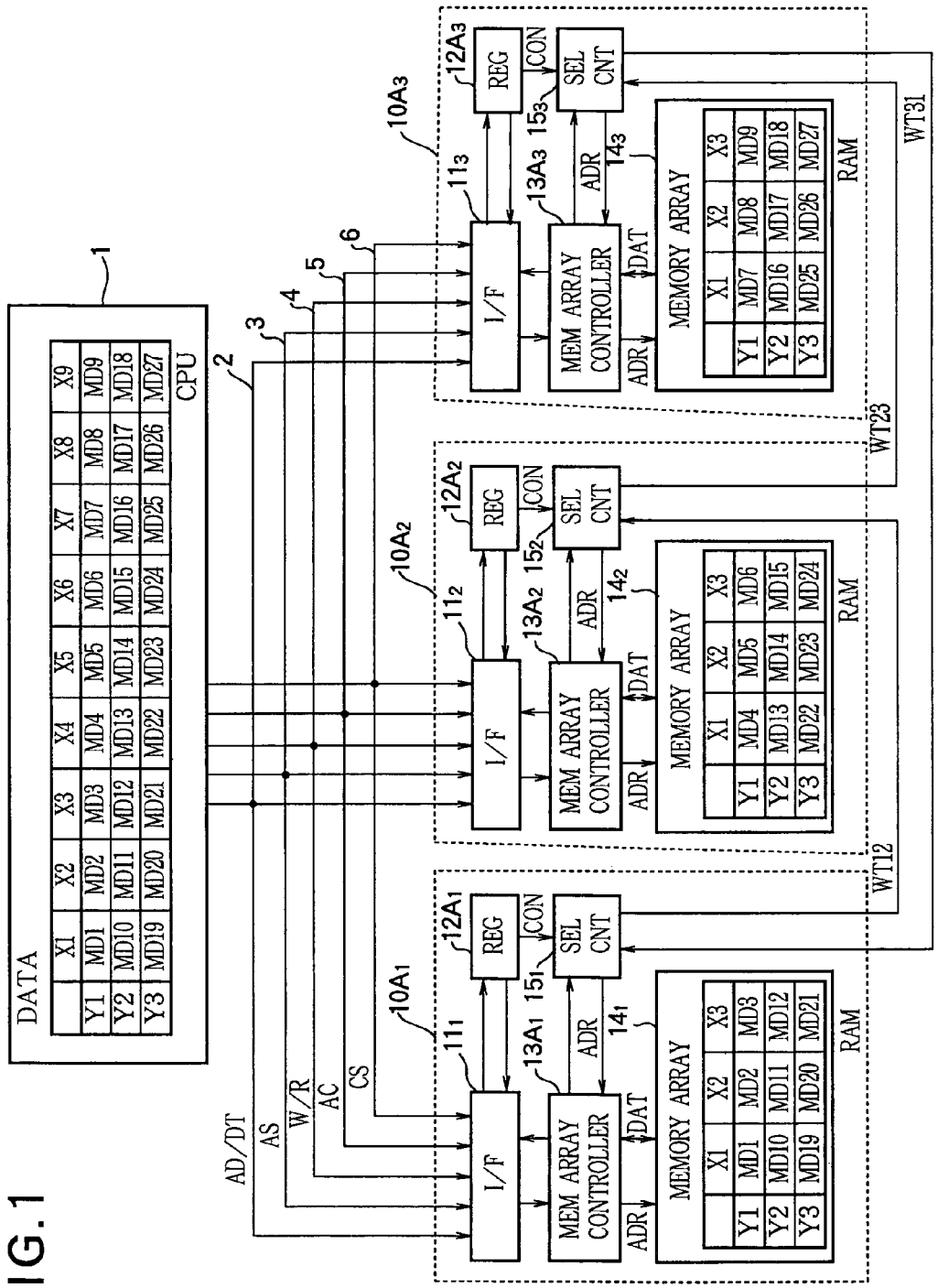
FIG. 1 is a block diagram of a system embodying the present invention.

An embodiment of the invention will now be described with reference to the attached drawings, in which similar elements are indicated by similar reference characters.

Referring to FIG. 1, the memory chips in the embodiment are random access memory (RAM) chips $10A_1$, $10A_2$, $10A_3$ accessed by a central processing unit (CPU) 1 via a shared bus. The bus signal lines include a plurality of address/data (AD/DT) signal lines 2 (shown as one line for simplicity), an address strobe (AS) signal line 3, a write/read (WR) signal line 4, an access clock (AC) signal line, and a plurality of chip select (CS) signal lines 6 (shown as one line for simplicity).

The address/data signal lines 2 carry address signals, command signals, and data signals. Address and command signals are sent from the CPU 1 to the memory chips. Data signals may be sent in either direction.

The address strobe signal is output from the CPU 1 to the memory chips. The address strobe signal goes high to indicate that the signals on the address/data signal lines 2 are address or command signals, and low to indicate that these signals are data signals.

The write/read signal W/R indicates the direction of the signals on the address/data signal lines 2. When W/R is high, the signals on the address/data signal lines 2 are sent by the CPU 1 and received by the memory chips $10A_1$, $10A_2$, $10A_3$. When W/R is low, the signals on the address/data signal lines 2 are sent by the memory chips and received by the CPU 1.

The access clock AC synchronizes the signals on the address/data signal lines 2. The signals on the address/data signal lines 2 are valid while the access clock signal is low and are latched at the rising edge of the access clock signal.

The chip select signals CS select the memory chips $10A_1$, $10A_2$, $10A_3$ individually. The selected memory chip is available for data read or write access.

Each memory chip $10A_i$ (i=1 to 3) comprises an interface (I/F) $11_i$, a register (REG) $12A_i$, a memory array controller (MEM ARRAY CONTROLLER) $13A_i$, a memory array $14_i$, and a selection controller (SEL CNT) $15_i$. The register $12A_i$, memory array controller $13A_i$, and selection controller $15_i$ constitute the memory control circuit.

The interface $11_i$ receives control signals from the CPU 1 via the shared bus and sets them in the register $12A_i$ or sends them to the memory array controller $13A_i$, and transfers data between the memory array controller $13A_i$ and the CPU 1.

The register $12A_i$ holds control information set by the CPU 1 via the interface $11_i$. This information includes a control bit (CON) that enables and disables the operation of the selection controller $15_i$. The register $12A_i$ outputs the value of this bit continuously to the selection controller $15_i$. Information stored in the register $12A_i$ may also be read by the CPU 1 through the interface $11_i$. Although only one register $12A_i$ is shown in the drawing, there may be a plurality of registers.

The memory array controller $13A_i$ controls the reading and writing of data in the memory array $14_i$ according to commands and addresses received from the CPU 1, sends address signals (ADR) to the memory array $14_i$, and transfers data (DAT) between the interface $11_i$ and memory array $14_i$. In addition, the memory array controller $13A_i$ stores addresses in the selection controller $15_i$, and receives the stored addresses from the selection controller $15_i$.

The memory array $14_i$ is organized into rows and columns. For simplicity, an array with three rows and three columns is shown, although in practice the number of rows and columns may be much larger. Memory locations are identified by column addresses X1 to X3 and row addresses Y1 to Y3.

The selection controller $15_i$ holds the address stored by the memory array controller $13_i$ and increments it in synchronization with the access clock signal, sends an access wait signal WTij to memory chip $10A_j$, and receives an access wait signal WTki from memory chip $10A_k$, where j and k are integers differing from each other and from i (j, k=1 to 3). The access wait signal lines interconnect the memory chips $10A_1$ to $10A_3$ in a loop: memory chip $10A_1$ sends access wait signal WT12 to memory chip $10A_2$; memory chip $10A_2$ sends access wait signal WT23 to memory chip $10A_3$; memory chip $10A_3$ sends access wait signal WT31 to memory chip $10A_1$. When the selection controller $15_i$ is enabled by the CON control bit signal, the sending and receiving of access wait signals is related to the incrementing of the stored address as described below. When the selection controller $15_i$ is disabled by the CON control bit signal, it simply sends the incoming access wait signal WTki to the next memory chip as the outgoing access wait signal WTij.

The selection controller $15_i$ also generates access start and end signals (not shown) that control the memory array controller $13A_i$.

Read and write operations in which the CPU 1 views the memory chips $10A_1$, $10A_2$, $10A_3$ as a single memory will now be described. The CPU 1 treats the memory space of the memory chips $10A_1$, $10A_2$, $10A_3$ as a combined array with three rows and nine columns, identified by column addresses X1 to X9 as shown in FIG. 1. The CPU 1 will write and then read data words MD1 to MD27 in this memory space. Access takes place in column-row order, all nine columns in each row being accessed before the next row is accessed. Access accordingly cycles among the three memory chips $10A_1$, $10A_2$, $10A_3$.

To enable this type of data access, before the access operations begin, the CPU 1 sends the memory chips $10A_1$, $10A_2$, $10A_3$ initialization commands that set their internal control signals CON to the active logic level, enabling the selection controller in each chip.

Figure 2:
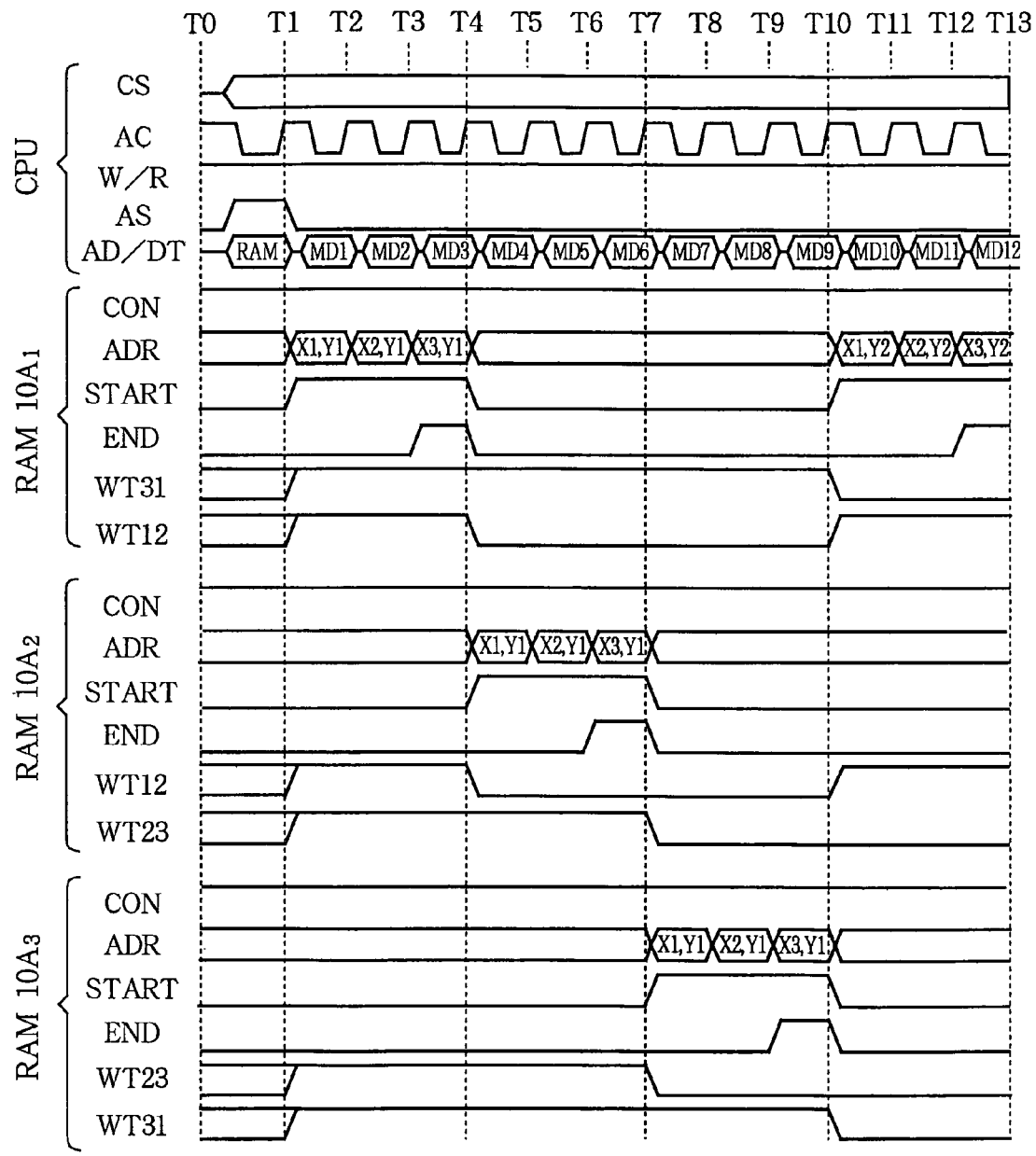
FIG. 2 is a timing waveform diagram illustrating write access in the system in FIG. 1.

FIG. 2 illustrates the first part of the write access sequence. The CPU 1 holds the write/read signal W/R at the high logic level, designating write access, throughout the write access sequence. The illustrated address signals (ADR) show the values stored in the selection controllers $15_1$, $15_2$, $15_3$ in the memory chips $10A_1$, $10A_2$, $10A_3$.

Between times T0 and T1, the CPU 1 sets the chip select signals CS to a value (denoted RAM1) selecting the first memory chip $10A_1$, outputs a write command (RAM) on the address/data signal lines 2, and drives the address strobe signal AS high, transferring the write command to all three memory chips $10A_1$, $10A_2$, $10A_3$.

At time T1 the address strobe signal AS goes low, the access clock signal AC goes high, and the write command and chip select signals are latched, placing all three memory chips $10A_1$ to $10A_3$ in the write mode. All three access wait signals WT12, WT23, WT31 go high. In the selected memory chip $10A_1$, selection controller $15_1$ drives the access start signal (START) to the active (high) logic level, and memory array controller $13A_1$ writes the address of the first column in the first row (X1, Y1) in selection controller $15_1$.

In the intervals from times T1 to T2, T2 to T3, and T3 to T4, the CPU 1 sets data MD1, MD2, and MD3 on the address/data signal lines 2, and memory array controller $13A_1$ writes these data at successive addresses (X1, Y1), (X2, Y1) and (X3, Y1) in the first row in memory array $14_1$. Selection controller $15_1$ increments the column address at times T2 and T3.

When the selection controller $15_1$ recognizes the last column address X3 at time T3, it activates the internal access end signal (END). At time T4, selection controller $15_1$ drives the access start and end signals to the inactive (low) level, temporarily stops incrementing addresses, and drives access wait signal WT12 low. While WT12 is low, the first memory chip $10A_1$ remains in the write access mode but deselects itself and does not latch data on the address/data signal lines 2.

When selection controller $15_2$ in the second memory chip $10A_2$ recognizes the high-to-low transition of the WT12 signal, it activates the access start signal. Memory array controller $13A_2$ then performs the same operations as memory array controller $13A_1$ in the first memory chip $10A_1$ to write data MD4, MD5, MD6, which the CPU 1 places on the address/data signal lines 2 from time T4 to time T7, at addresses (X1, Y1), (X2, Y1), (X3, Y1) in memory array $14_2$. The first address (X1, Y1) is written in selection controller $15_2$ by memory array controller $13A_2$ at time T4 and incremented at times T5 and T6.

When selection controller $15_2$ recognizes that the last column address X3 has been reached at time T6, it activates the internal access end signal in the second memory chip $10A_2$. At time T7, selection controller $15_2$ drives the access start and end signals and access wait signal WT23 low, deselecting the second memory chip $10A_2$.

When selection controller $15_3$ in the third memory chip $10A_3$ recognizes the high-to-low transition of the WT23 signal, it selects the third memory chip $10A_3$ by driving its internal access start signal to the high level. Data MD7, MD8, and MD9 are now written at addresses (X1, Y1), (X2, Y1), and (X3, Y1) in memory array $14_3$ from time T7 to time T10 by the same procedure as followed in the second memory chip $10A_2$ from time T4 to time T7. At time T10, selection controller $15_3$ drives the internal access start and end signals in memory chip $10A_3$ and access wait signal WT31 to the low level.

When selection controller $15_1$ in the first memory chip $10A_1$ recognizes the high-to-low transition of access wait signal WT31, it restores access wait signal WT12 to the high level, reactivates the internal access start signal, and increments the stored address from (X3, Y1) to (X1, Y2). From time T10 to time T13, data MD10, MD11, and MD12 are written at successive addresses (X1, Y2), (X2, Y2), and (X3, Y2) in the second row in memory array $14_1$ by the same procedure as followed in the second memory chip $10A_2$ from time T4 to time T7.

Access continues to cycle in this way among the three memory chips $10A_1$, $10A_2$, $10A_3$ until all the remaining data up to MD27 have been stored at the locations shown in FIG. 1 in the three memory arrays $14_1$, $14_2$, $14_3$.

A feature of this write access sequence is that the CPU 1 only has to generate chip select signals once, at the beginning of the sequence. Thereafter, the access wait signals generated by the memory chips themselves override the chip select signals, shifting access from chip to chip at the proper times.

Another feature is that commands have to be placed on the address/data signal lines 2 only once, in the interval from time T0 to time T1. Thereafter, the CPU 1 can simply place successive data values (MD1-MD27) on the address/data signal lines 2 in successive clock cycles.

The entire write access sequence is accordingly completed in a minimum length of time with a minimum processing load on the CPU 1.

Figure 3:
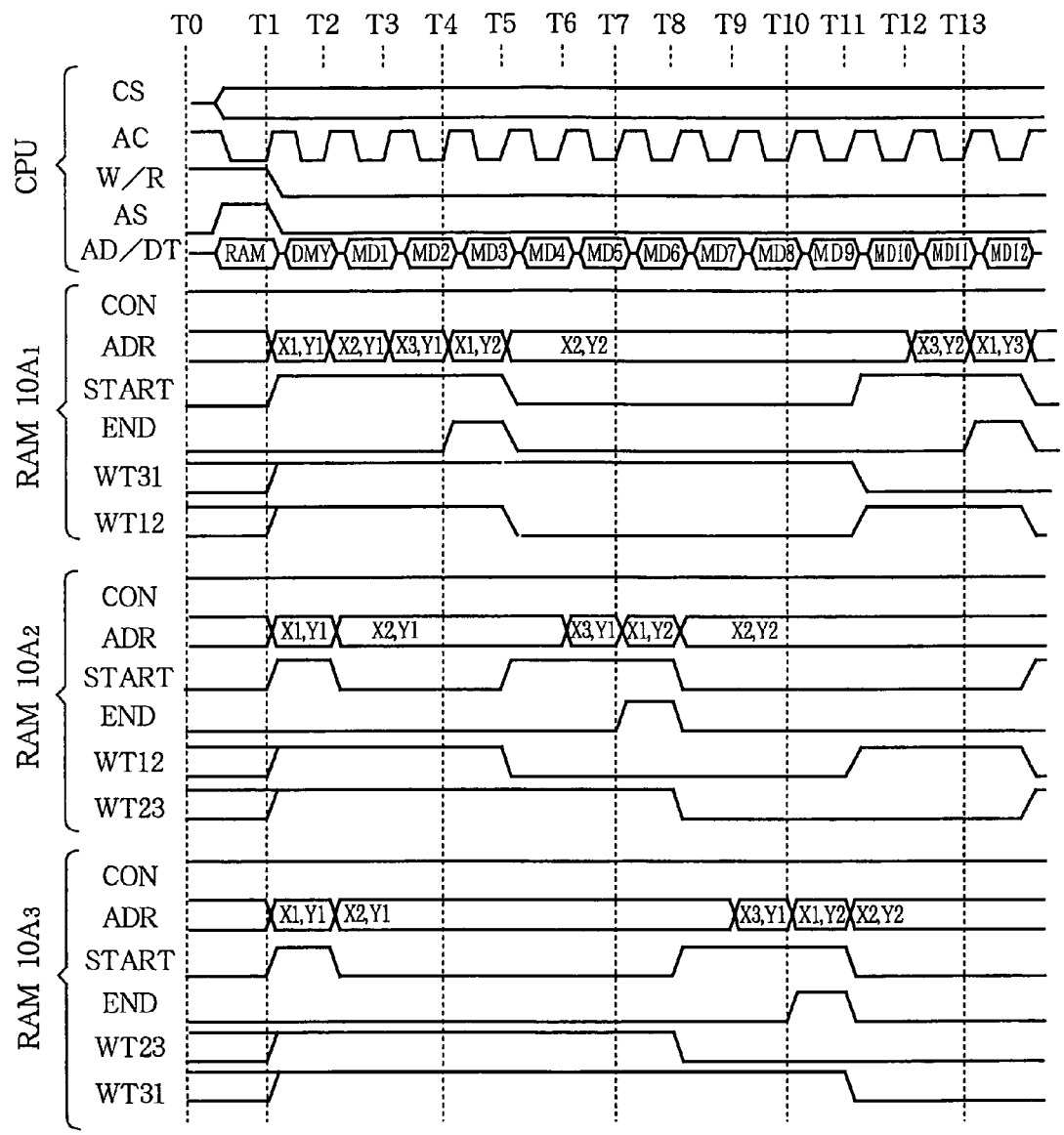
FIG. 3 is a timing waveform diagram illustrating read access in the system in FIG. 1.

The read access sequence, the first part of which is illustrated in FIG. 3, is generally similar, the three memory chips using the access wait signals to shift access among themselves autonomously. The read access sequence is more complex, however, because of the delay from the generation of a new row address in a memory chip until the data in the new row become available for output. The delay time, which is necessary for sensing and amplification of the data, is equal to one cycle of the access signal AC in this embodiment.

Between times T0 and T1, while continuing to hold the write/read signal W/R at the high logic level, the CPU 1 sets the chip select signals CS to a value (RAM1) selecting the first memory chip $10A_1$, sets a read command (denoted RAM) on the address/data signal lines 2, and drives the address strobe signal AS high, transferring the read command to all three memory chips $10A_1$, $10A_2$, $10A_3$.

At time T1 the address strobe signal AS goes low, the access clock signal AC goes high, and the read command and chip select signals are latched, placing all three memory chips $10A_1$, $10A_2$, $10A_3$ in the read mode. The selection controllers $15_1$, $15_2$, $15_3$ drive all three access wait signals WT12, WT23, and WT31 and all three access start signals (START) to the high logic level. In addition, the memory array controllers $13A_1$, $13A_2$, $13A_3$ all write the first address in the first row (X1, Y1) into the selection controllers $15_1$, $15_2$, $15_3$.

Between times T1 and T2, sense amplification of the data in the first row takes place in all three memory chips $10A_1$, $10A_2$, $10A_3$. The selected memory chip $10A_1$ outputs dummy data (DMY) on the address/data signal lines 2.

Between times T2 and T3, memory array controller $13A_1$ places the data MD1 stored at address (X1, Y1) in the first memory chip $10A_1$ in an output buffer (not shown) for output on the address/data signal lines 2, and selection controller $15_1$ increments to the next address (X2, Y1). The CPU 1 reads data MD1 from the address/data signal lines 2 in synchronization with the rise of the access signal AC at time T3. The addresses held in the selection controllers $15_2$, $15_3$ in the nonselected memory chips $10A_2$ and $10A_3$ are also incremented to (X2, Y1), but no data are output from these chips.

Between times T3 and T4, the data MD2 stored at address (X2, Y1) in memory chip $10A_1$ are similarly buffered and read and the address stored in selection controller $15_1$ is incremented to (X3, Y1). Selection controller $15_1$ recognizes that the end of the first row has been reached and activates the access end signal at time T4. The addresses held in the selection controllers $15_2$, $15_3$ in the nonselected memory chips $10A_2$ and $10A_3$ remain at (X2, Y1) and are not incremented.

Between times T4 and T5, the data MD3 stored at address (X3, Y1) in memory chip $10A_1$ are similarly buffered and read. The address stored in selection controller $15_1$ is incremented to (X1, Y2), causing memory array controller $13A_1$ to start sense amplification of the data in the second row in the memory array $14_1$.

At time T5, selection controller $15_1$ drives the access start and end signals and access wait signal WT12 low. These signals will remain low during the period in which the first memory chip $10A_1$ is deselected, until time T11. The address held in selection controller $15_1$ is incremented to (X2, Y2) at time T5 and then left at this value.

When the selection controller $15_2$ in the second memory chip $10A_2$ recognizes the high-to-low transition of access wait signal WT12 at time T5, it drives the internal access start signal in this memory chip to the high level. The second memory chip $10A_2$ is now selected for access. The data MD4 stored at address (X1, Y1), which have been available for output since time T2, are placed in the output buffer (not shown) and output on the address/data signal lines 2. The CPU 1 latches data MD4 at time T6.

Between times T6 and T7, the data MD5 stored at address (X2, Y1) in memory chip $10A_2$ are buffered and read and the address stored in selection controller $15_2$, which has remained at (X2, Y1) since time T2, is incremented to (X3, Y1). Selection controller $15_2$ recognizes that the end of the first row in memory array $14_2$ has been reached and activates the access end signal at time T7.

Between times T7 and T8, the data MD6 stored at address (X3, Y1) in memory chip $10A_2$ are similarly buffered and read and the address stored in selection controller $15_2$ is incremented to (X1, Y2), causing memory array controller $13A_2$ to start sense amplification of the data in the second row of memory array $14_2$. At time T8, selection controller $15_2$ increments its stored address to (X2, Y2) and drives the access start and end signals and access wait signal WT23 low, deselecting the second memory chip $10A_2$. Selection controller $15_3$ now places the third memory chip $10A_3$ in the selected state.

Data MD7 to MD9 are then read in a similar manner from the third memory chip $10A_3$ from time T8 to time T11. At time T11 selection controller $15_3$ drives the access start and end signals and access wait signal WT31 low, and access returns to the first memory chip $10A_1$.

From time T11 to time T14, the first memory chip $10A_1$ outputs the data MD10 to MD12 stored in the second row of memory array $14_1$, which were sensed and amplified between times T4 and T5 and have been held in readiness since then. The procedure is the same as used by the second and third memory chips $10A_2$, $10A_3$ to output data MD4 to MD9. Thereafter, access continues to cycle among the three memory chips until all data up to MD27 have been read.

This read access sequence has the same features as noted in the write access sequence described above: the CPU 1 only has to generate chip select signals and place commands on the address/data signal lines 2 once, at the beginning of the sequence. Another feature is that read access is delayed for sense amplification only once, from time T0 to time T1. Thereafter, each memory chip completes sense amplification well in advance of data output, so read access can shift immediately from one memory chip to another with no delay. The entire read access sequence is thus completed in a minimum length of time with a minimum processing load on the CPU 1.

Figure 4:
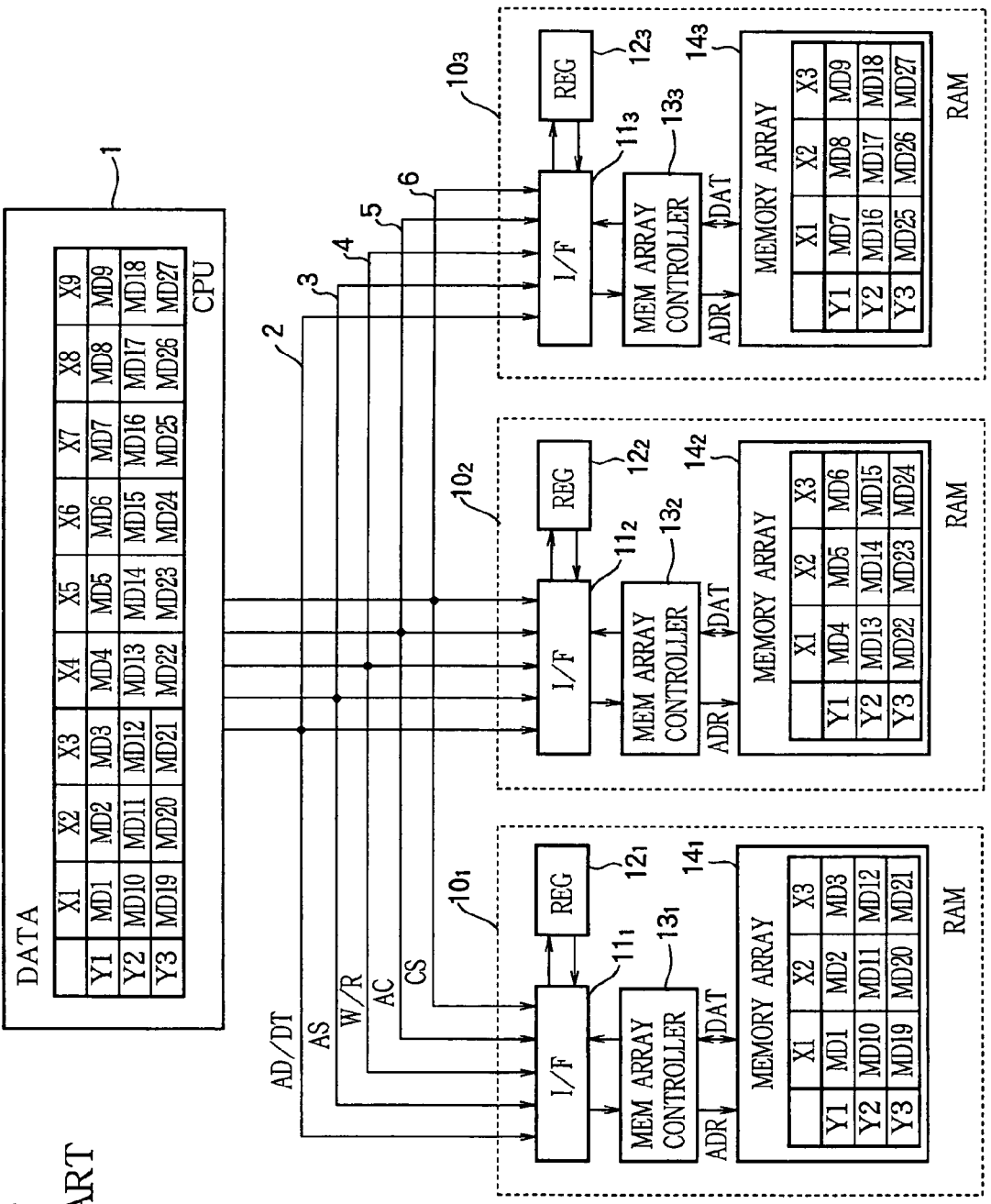
FIG. 4 is a block diagram of a conventional system.

For comparison, read and write access sequences using conventional memory chips that do not generate access wait signals will now be described. FIG. 4 shows a system including a CPU 1 and three conventional memory chips $10_1$, $10_2$, $10_3$. These memory chips are identical to the novel memory chips shown in FIG. 1 except that they have no selection controller. Accordingly, the registers $12_1$, $12_2$, $12_3$ do not output a CON signal, and the memory array controllers $13_1$, $13_2$, $13_3$ store addresses internally and increment the addresses themselves.

Figure 5:
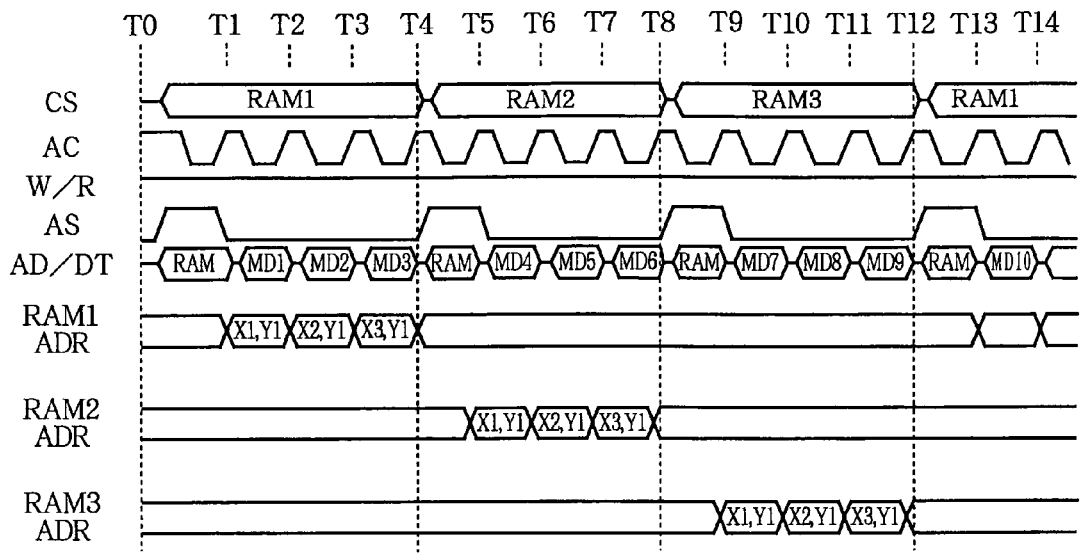
FIG. 5 is a timing waveform diagram illustrating write access in the system in FIG. 4.

FIG. 5 shows the first part of a conventional write access sequence for storing data MD1 to MD27 in the conventional memory chips $10_1$, $10_2$, $10_3$. The sequence starts in the same way as the novel sequence in FIG. 2 from time T0 to time T4. Between times T4 and T5, however, the CPU 1 must change the chip select signals to a value (denoted RAM2) selecting the second memory chip $10_2$ instead of the first memory chip $10_1$, and must place another write command (RAM) on the address/data signal lines 2 for the second memory chip $10_2$ to receive. There is accordingly a one-cycle delay between the writing of data MD3 in the first memory chip $10_1$ and the writing of data MD4 in second memory chip $10_2$.

Similar delays occur between times T8 and T9, when access shifts from the second memory chip $10_2$ to the third memory chip $10_3$ (the third memory chip is selected by a value denoted RAM3 on the chip select signal lines), then between times T12 and T13, when access shifts from the third memory chip $10_3$ back to the first memory chip $10_1$, and so on. As a result, the conventional write access sequence in FIG. 5 is slower than the novel write access sequence in FIG. 2 by a factor of substantially 4:3.

Figure 6:
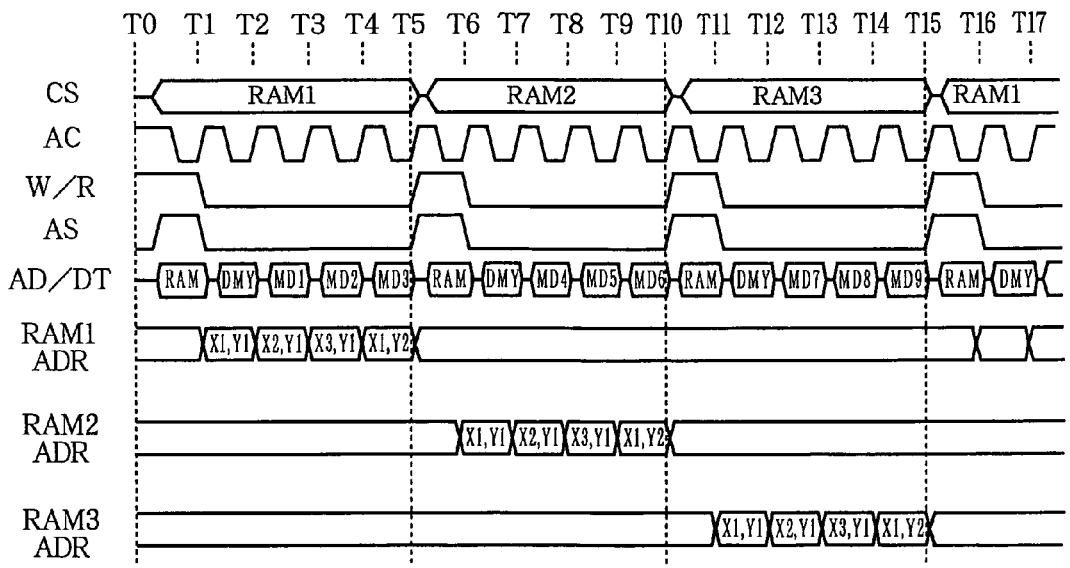
FIG. 6 is a timing waveform diagram illustrating read access in the system in FIG. 4.

FIG. 6 shows the first part of a conventional read access sequence for reading data MD1 to MD27 from the conventional memory chips $10_1$, $10_2$, $10_3$. The sequence starts in the same way as the novel sequence in FIG. 3 from time T0 to time T5. Between times T5 and T7, however, the CPU 1 must first, during one clock cycle, change the chip select signals to the value (RAM2) selecting the second memory chip $10_2$ and place a read command (RAM) on the address/data signal lines 2, and must then wait for another clock cycle while the second memory chip $10_2$ sense and amplifies the data in the first row in its memory array $14_2$. There is accordingly a two-cycle delay between the reading of data MD3 from the first memory chip $10_1$ and the reading of data MD4 from second memory chip $10_2$.

Similar delays occur between times T10 and T12, between times T15 and T17, and so on. The conventional read access sequence in FIG. 6 is accordingly slower than the novel read access sequence in FIG. 3 by a factor of about 5:3.

The invention is not limited to the embodiment shown in FIGS. 1 to 3. For example, the memory chips need not be RAM chips; the invention is applicable to any type of memory chip. Each memory chip may have a plurality of memory arrays or banks. The CPU 1 may be replaced by another type of processor, or by a separate memory controller.

Many variations in the memory control circuit itself are also possible. The following are some examples.

The low-to-high transitions of access wait signals WT23 and WT31 at time T1 in FIGS. 2 and 3 may be delayed until the following high-to-low transitions of access wait signals WT12 and WT23, respectively.

Alternatively, the low-to-high transitions of the access wait signals may be synchronized with the low-to-high transitions of the internal access end signals.

The active level of any signal may be either the high level or the low level.

Data access need not start at the first column in row one; it may start at an arbitrary address specified by the CPU 1.

Addresses may be decremented instead of incremented. The incrementing and/or decrementing may be done by the memory array controller instead of the selection controller.

If extra output buffers are provided, then during read access, amplification of the data in a given row in a memory array may start an arbitrary number of columns before the end of access to the preceding row, to provide adequate time for sense amplification.

Those skilled in the art will recognize that still further variations are possible within the scope of the invention, which is defined in the appended claims.

What is claimed is:

1. A memory control circuit disposed in a memory chip, the memory chip having a memory array storing data for access by an external device external to the memory chip, the memory chip operating in a selected state in which said access is enabled and a deselected state in which said access is disabled, the memory control circuit including a selection controller operable to switch the memory chip between the selected and deselected states, the selection controller also sending and receiving access wait signals to and from at least one other memory chip, the access wait signals indicating transitions between the selected state and the deselected state.

2. The memory control circuit of claim 1, wherein the access wait signals include:
   a first access wait signal sent by the selection controller when the selection controller places the memory chip in the deselected state; and
   a second access wait signal received by the selection controller, causing the selection controller to place the memory chip in the selected state.

3. The memory control circuit of claim 1, wherein the memory array is organized into rows and columns.

4. The memory control circuit of claim 3, wherein the selection controller places the memory chip in the deselected state when said access reaches a particular column in the memory array.

5. The memory control circuit of claim 4, wherein the particular column is at an end of the rows in the memory array.

6. The memory control circuit of claim 3, further comprising a memory array controller for controlling access to the data stored in the memory array.

7. The memory control circuit of claim 6, wherein the memory array controller stores address information identifying a location in the memory array in the selection controller.

8. The memory control circuit of claim 7, wherein the selection controller successively alters the stored address information so that access proceeds to successive locations in the memory array.

9. The memory control circuit of claim 6, wherein said access includes write access, during which:
   the memory array controller writes data in one row in the memory array;
   the selection controller then places the memory chip in the deselected state and sends one of the access wait signals to allow the write access to shift to said at least one other memory chip;
   the selection controller then places the memory chip in the selected state responsive to reception of another one of the access wait signals; and
   the memory array controller then writes data in another row in the memory array.

10. The memory control circuit of claim 6, wherein said access includes read access commencing with the memory chip in the deselected state, during which read access:
    the memory array controller amplifies data in one row in the memory array;
    the selection controller then places the memory chip in the selected state responsive to reception of one of the access wait signals; and
    the memory array controller then transfers the amplified data from the one row to the external device.

11. The memory control circuit of claim 6, wherein said access includes read access commencing with the memory chip in the selected state, during which read access:
    the memory array controller amplifies data in one row in the memory array;
    the memory array controller then transfers the amplified data from the one row to the external device;
    the memory array controller then amplifies data in another row in the memory array;
    the selection controller places the memory chip in the deselected state and sends one of the access wait signals to allow the read access to shift to said at least one other memory chip;
    the selection controller then places the memory chip in the selected state responsive to reception of another one of the access wait signals; and
    the memory array controller then transfers the amplified data from said another row to the external device.

12. The memory control circuit of claim 1, further including a register storing control data for enabling and disabling the selection controller.

13. The memory control circuit of claim 12, further comprising an interface for receiving the control data from the external device and storing the control data in the register.

14. The memory control circuit of claim 1, wherein the memory chip is a random access memory chip.

15. A memory chip including the memory control circuit of claim 1.

16. A random access memory chip including the memory control circuit of claim 1.

17. A system comprising a plurality of memory chips, each including the memory control circuit of claim 1, wherein said access shifts cyclically among the memory chips under control of the access wait signals.

18. The system of claim 17, further comprising a processor functioning as said external device and a shared bus connecting the processor to the plurality of memory chips.

19. The system of claim 18, wherein the processor accesses data in all of the memory chips by sending on the shared bus a chip select signal selecting just one of the memory chips.

* * * * *